(12) United States Patent
Lee et al.

(10) Patent No.: US 10,728,479 B2
(45) Date of Patent: Jul. 28, 2020

(54) IMAGE SENSING DEVICE

(71) Applicant: SK hynix Inc., Gyeonggi-do (KR)

(72) Inventors: Won Jun Lee, Gyeonggi-do (KR); Bo Kwang Hwang, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/204,210

(22) Filed: Nov. 29, 2018

(65) Prior Publication Data

US 2019/0349544 A1    Nov. 14, 2019

(30) Foreign Application Priority Data

May 10, 2018  (KR) .......................... 10-2018-0053618

(51) Int. Cl.
*H04N 5/369* (2011.01)
*H04N 5/378* (2011.01)
*H01L 27/146* (2006.01)

(52) U.S. Cl.
CPC ... *H04N 5/36963* (2018.08); *H01L 27/14621* (2013.01); *H01L 27/14623* (2013.01); *H01L 27/14643* (2013.01); *H04N 5/378* (2013.01)

(58) Field of Classification Search
CPC ............... H04N 5/36963; H04N 5/378; H01L 27/14623; H01L 27/14621; H01L 27/14643
See application file for complete search history.

(56) References Cited

U.S. PATENT DOCUMENTS

| 8,767,100 | B2* | 7/2014 | Chen .................... | H04N 5/3572 348/187 |
| 2009/0122171 | A1* | 5/2009 | Suzuki ............... | H04N 5/23212 348/294 |
| 2011/0069061 | A1* | 3/2011 | Nakamura ........... | G09G 3/3225 345/214 |
| 2012/0012961 | A1* | 1/2012 | Kataoka ............ | H01L 27/14621 257/432 |
| 2012/0025059 | A1* | 2/2012 | Kawashima ...... | H01L 27/14623 250/208.1 |
| 2019/0088700 | A1* | 3/2019 | Yang ................. | H01L 27/14623 |

FOREIGN PATENT DOCUMENTS

KR    10-0749264 B1    8/2007

* cited by examiner

*Primary Examiner* — Victor A Mandala
(74) *Attorney, Agent, or Firm* — Perkins Coie LLP

(57) ABSTRACT

An image sensing device is provided to provide a same effect as in performing testing associated with different integration or exposure times without changing an exposure or integration time. The image sensing device includes an active pixel region configured to include a plurality of active pixels, a dummy pixel region located at an outer wall of the active pixel region, configured to include a plurality of dummy pixels, and a light quantity control pattern configured to allow different quantities of light to be incident upon the respective dummy pixels.

19 Claims, 10 Drawing Sheets

DP(1,1)

DP(2,1)

DP(3,1)

DP(N,1)

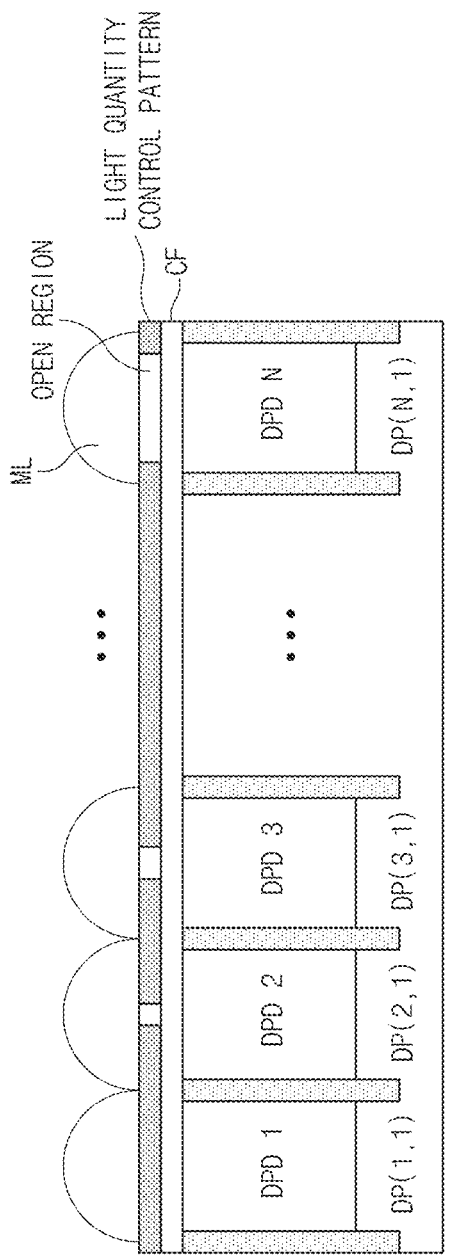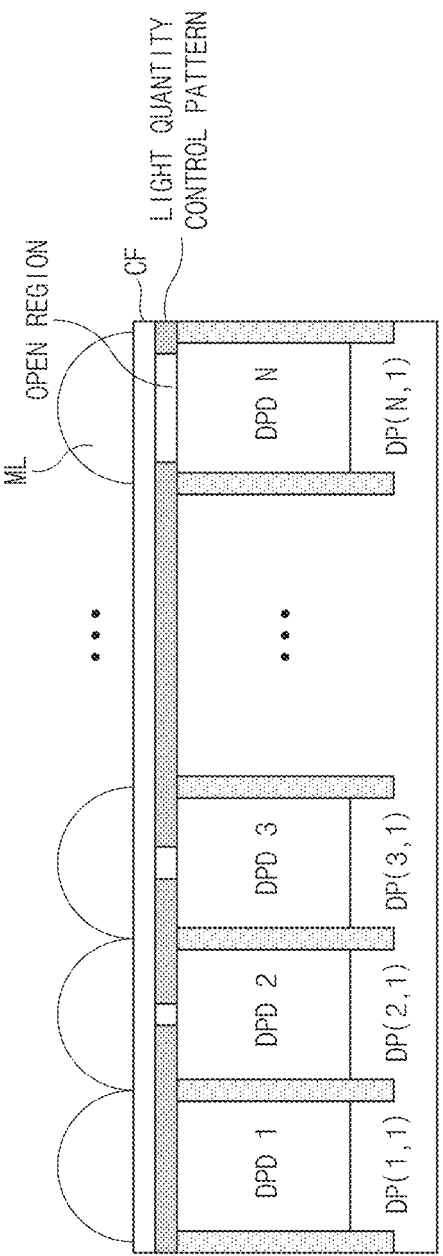
FIG.3A
FIG.3B

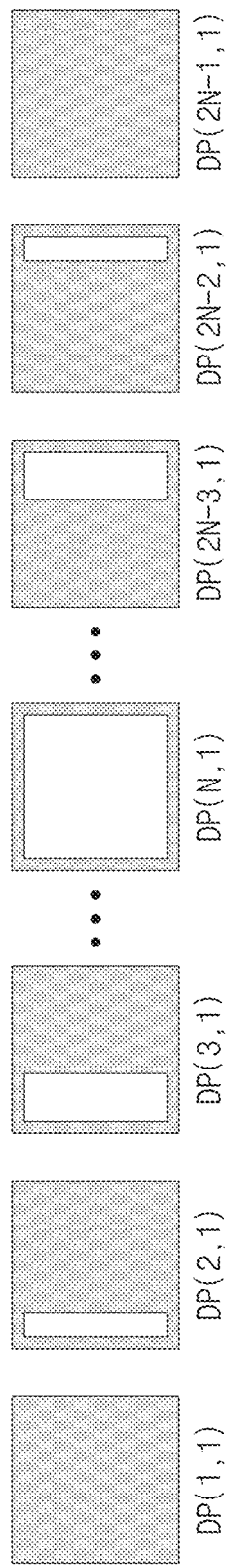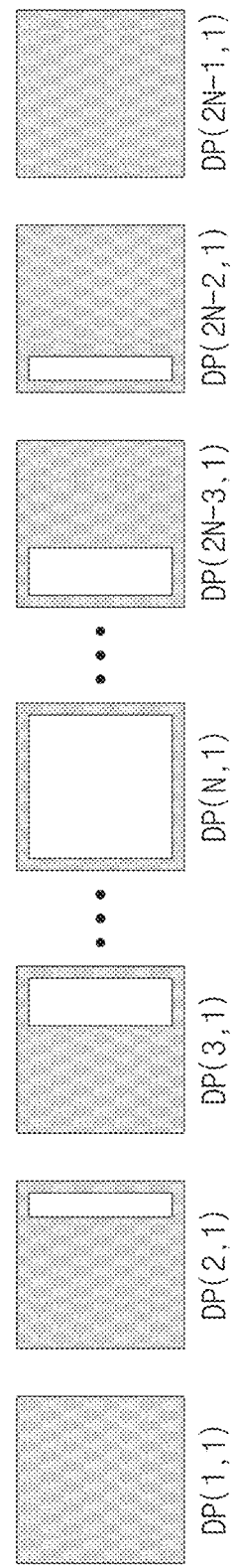

IMAGE SENSING DEVICE

CROSS-REFERENCE TO RELATED APPLICATION

This patent document claims the priority and benefits of Korean patent application No. 10-2018-0053618 filed on 10 May 2018, which is hereby incorporated in its entirety by reference.

TECHNICAL FIELD

The technology and implementations disclosed in this patent document relate to an image sensing device.

BACKGROUND

An image sensing device is a device for capturing at least one image using photosensitive characteristics semiconductors that react to light. With the increasing development of computer industries and communication industries, demand for high-quality and high-performance image sensors is rapidly increasing in various fields, for example, digital cameras, camcorders, personal communication systems (PCSs), game consoles, surveillance cameras, medical micro-cameras, robots, etc.

Image sensing devices may be broadly classified into CCD (Charge Coupled Device)-based image sensing devices and CMOS (Complementary Metal Oxide Semiconductor)-based image sensing devices. Recently, since an analog control circuit and a digital control circuit can be directly implemented as a single integrated circuit (IC), CMOS-based image sensing devices are rapidly come into widespread use.

SUMMARY

This patent document provides, among others, designs of an image sensing device that substantially obviates one or more problems due to limitations and disadvantages of the related art.

An embodiment of the disclosed technology relates to an image sensing device capable of simultaneously performing testing associated with different integration times without changing an integration time.

In accordance with an aspect of the disclosed technology, an image sensing device comprises an active pixel region configured to include a plurality of active pixels which detect light of a scene to produce pixel signals representing the detected scene including spatial information of the detected scene, a dummy pixel region including dummy pixels located at different locations from locations of the active pixels of the active pixel region, each dummy pixel structured to detect light, and a light quantity control pattern located over the dummy pixel region and configured to respectively provide different optical shading over the dummy pixels to control different quantities of light to be incident upon the respective dummy pixels to generate different dummy pixel output signals.

In some implementations, the light quantity control pattern is configured to allow the respective dummy pixels to have open regions with different sizes from one another, the light being incident on the respective dummy pixels through the open regions. In some implementations, the open regions are regions that are not shielded by the light quantity control pattern in light incident surfaces of the plurality of dummy pixels. In some implementations, the light quantity control pattern is formed in the plurality of dummy pixels arranged in a first dummy row line and allows the open regions of the respective dummy pixels to have sizes increasing in a direction. In some implementations, the light quantity control pattern includes: square-shaped open regions, widths of which are increased with a constant ratio in the direction; slit-shaped open regions, lengths of which are constantly maintained and widths of which are increased with the constant ratio in the direction; or circular open regions, widths of which are increased with the constant ratio in the direction.

In some implementations, the light quantity control pattern is formed in the plurality of dummy pixels arranged in a first dummy row line, and allows the open regions of the respective dummy pixels to be arranged symmetrically with respect to a dummy pixel arranged in a middle of the first dummy row line. In some implementations, the dummy pixels are arranged in a first dummy row line and a second dummy row line of the dummy pixel region. In some implementations, the light quantity control pattern includes: a first light quantity control pattern formed in some of the plurality of dummy pixels arranged in the first dummy row line and configured to allow the open regions of the respective dummy pixels to have sizes sequentially increased in a direction; and a second light quantity control pattern formed in remaining dummy pixels arranged in the second dummy row line and configured to allow the open regions of the respective dummy pixels to have sizes sequentially reduced in the direction. In some implementations, each of the plurality of dummy pixels includes: a dummy photodiode; and a color filter located over the dummy photodiode. In some implementations, the light quantity control pattern is located between the dummy photodiode and the color filter. In some implementations, the light quantity control pattern is located over the color filter.

In accordance with another aspect of the disclosed technology, an image sensing device is provided to include an active pixel region including a plurality of active pixels, and a dummy pixel region located separately from the active pixel region and including a plurality of dummy pixels that are structured to receive different quantities of incident light.

In some implementations, the image sensing device further comprises a light quantity control pattern formed over the plurality of the dummy pixels, and wherein each of the plurality of dummy pixels includes: a shade region shielded by the light quantity control pattern; and an open region defined by the shade region and configured to receive incident light. In some implementations, open regions of the dummy pixels have different sizes from one another. In some implementations, the open regions have sizes that are gradually increased in a first direction. In some implementations, the plurality of dummy pixels include: square-shaped open regions, widths of which are increased with a constant ratio in a direction; slit-shaped open regions, lengths of which are constantly maintained and widths of which are increased with the constant ratio in the direction; or circular open regions, widths of which are increased with the constant ratio in the direction. In some implementations, the dummy pixels are structured to respectively include different photosensors in different sizes to receive different amounts of incident light. In some implementations, the photosensors in the dummy pixels have a same width along a horizontal direction and have different heights from one another along a vertical direction. In some implementations, the photosensors in the dummy pixels have a same height along a vertical direction and have different widths from one another along a horizontal direction. In some implementations, the sizes of the photosensors in the dummy pixels increase along a direction through which the dummy pixels are arranged.

It is to be understood that both the foregoing general description and the following detailed description of embodiments are exemplary and explanatory.

BRIEF DESCRIPTION OF THE DRAWINGS

The above and other features and advantages of the disclosed technology will become readily apparent by reference to the following detailed description when considered in conjunction with the accompanying drawings wherein:

FIGS. 3A and 3B are cross-sectional views of an example of a dummy pixel region, which are taken along the line A-A' shown in FIG. 1 and illustrate dummy pixels arranged along a dummy row line.

FIGS. 7A and 7B are views illustrating light quantity control patterns of dummy pixels based on embodiments of the disclosed technology.

DESCRIPTION OF EMBODIMENTS

The disclosed technology can be implemented to provide an image sensing device including an active pixel region of optical sensing pixels for image sensing and a separate dummy pixel region near the active pixel region to include additional optical sensing pixels to sense input light power for improved imaging sensing. The optical sensing pixels in the active pixel region are used for image sensing and for representing the spatial and other imaging information of an input scene or image to be detected. The additional optical sensing pixels in the separate dummy pixel region are different and are not used directly to provide spatial and other imaging information. In this context, those pixels are referred to as "dummy pixels." However, such dummy pixels are designed and operated to provide supplemental information in the imaging operation of the active pixel region to improve overall imaging operation of the image sensing device. In the examples provided below, the dummy pixels of the disclosed technology are designed to control an amount of light entering each dummy pixel or an amount of light converted from each dummy pixel. Thus, the disclosed technology allows to obtain desired output signals with much less time and resources as compared to some other techniques. Reference will now be made in detail to certain embodiments, examples of which are illustrated in the accompanying drawings.

Figure 1:
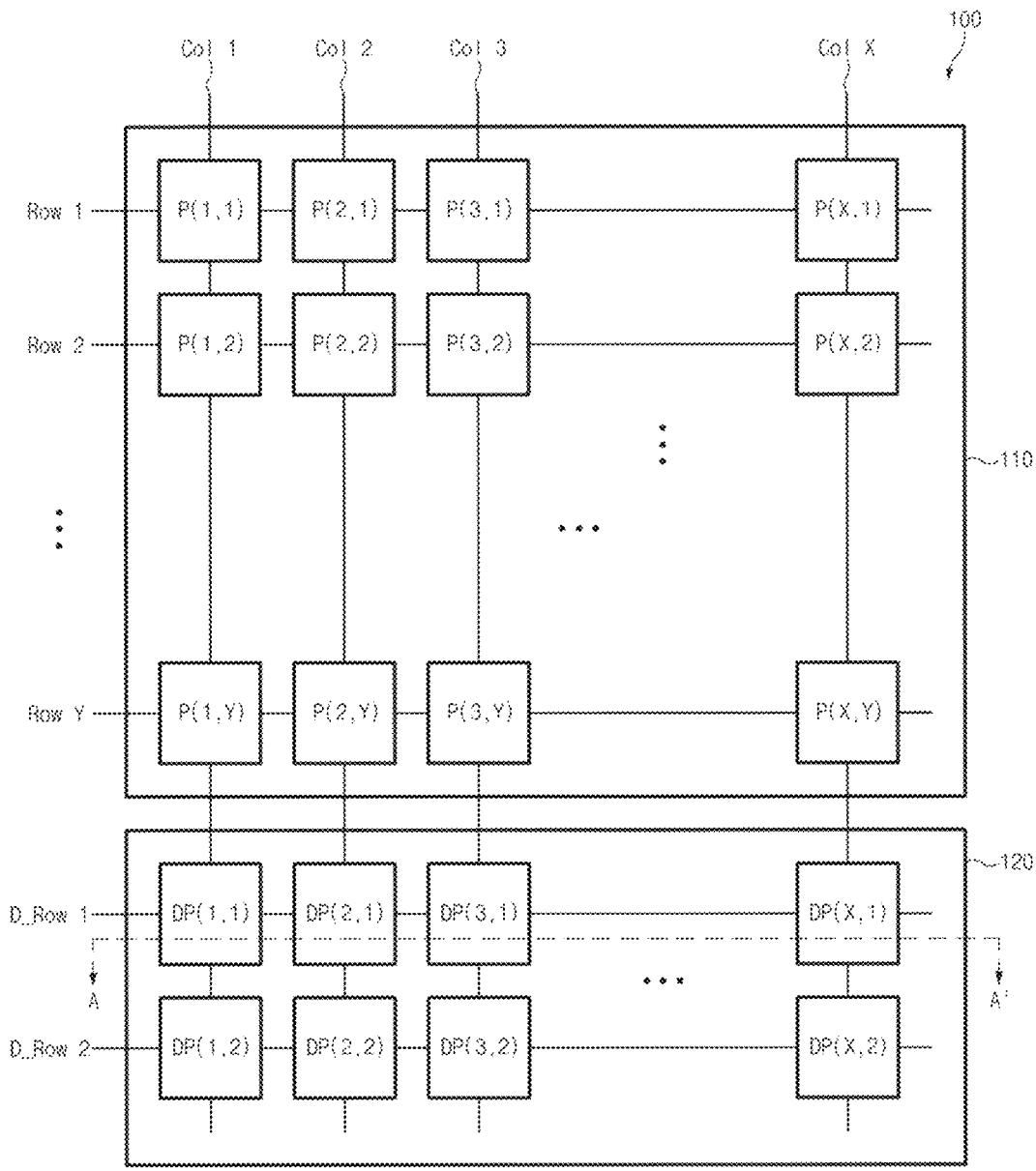
FIG. 1 is a structural diagram illustrating a representation of an example of an image sensing device according to an embodiment of the disclosed technology.

FIG. 1 is a structural diagram illustrating a representation of an example of an image sensing device according to an embodiment of the disclosed technology.

Referring to FIG. 1, the image sensing device 100 may include an active pixel region 110 and a dummy pixel region 120.

The active pixel region 110 may include (X×Y) active pixels {P (1,1) to P (X,Y)} that are arranged rows and columns. The active pixel region 110 includes first to X-th columns (Col 1 to Col X; X is an integer greater than 1) and first to Y-th rows (Row 1 to Row Y; Y is an integer greater than 1). Each active pixel may convert a detected quantity of light to a corresponding electrical signal and output the electrical signals (pixel signals) generated by the detected light. The pixel signals from the active pixel region 110 arranged from Row 1 to Row Y may be sequentially read out. In some implementations, the pixel signals from the active pixels arranged in a same row are read out at a same time. For example, the first to X-th pixel signals from the first to X-th active pixels {P (1,1) to P (X,1)} arranged in the first row (Row 1) of the active pixel region 110 may simultaneously be read out through the first to X-th column lines (Col 1 to Col X) during a first row selection time, and the first to X-th pixel signals from the first to X-th active pixels {P (1,2) to P (X,2)} arranged in the second row (Row 2) of the active pixel region 1110 may simultaneously be read out through the first to X-th column lines (Col 1 to Col X) during a second row selection time. In this manner, the pixel signals from the first to X-th active pixels arranged in each of the first to Y-th rows (Row 1 to Row Y) of the active pixel region 110 may be read out during the respective row selection time.

Each pixel signal may include a reset signal and a data signal. When the pixel signal is read out, the reset signal may be read out first and then, the data signal may be read out after the resent signal.

As shown by the example in FIG. 1, the dummy pixel region 120 may be located outside of the active pixel region 110 and separated from the active pixel region 110 in some implementations. The dummy pixel region 120 may include a plurality of dummy pixels {DP (1,1) to DP (X,2)} arranged in rows and columns in a way similar to the arrangement of active pixels in the active pixel region 110, albeit generally smaller in number. For example, the dummy pixel region 120 may be located at one side of the active pixel region 110. In a specific example of FIG. 1, the dummy pixel region 120 may include first to X-th dummy pixels {DP (1,1) to DP (X,1) and DP (1,2) to DP (X,2)} arranged in two dummy row lines (D_Row 1, D_Row 2). The number of dummy row lines is smaller than the number of active row lines and can be varied in implementations. For example, two dummy row lines are used in the embodiment of FIG. 1. The dummy pixel region 120 may be coupled to the active pixel region 110 through the column lines (Col 1 to Col X). As shown in FIG. 1, the first to X-th dummy pixels {DP (1,1) to DP (X,1)

and DP (1,2) and DP (X,2)} may be respectively coupled to the first to X-th column lines (Col 1 to Col X) coupled to the active pixel region 110.

Although the specific example in FIG. 1 illustrates the dummy pixel region 120 as being formed only at one side of the active pixel region 110, other arrangements of the dummy pixel region 120 are possible. For example, the dummy pixel region 120 may also be formed at the outer wall of or outside of the active pixel region 110 in more than one side of the active pixel region 110, and in some designs, may be arranged to enclose or surround the active pixel region 110. In other designs, a dummy pixel region 120 may be located between the active pixel region 110 and other optical sensing region such as an optical black region which may be disposed in a predetermined manner relative to the active pixel region 110. Unlike the active pixel region 110 that is designed to capture incident light or radiation of an image projected onto a surface of the image sensing device 100, the pixels in an optical black region are shielded from incident light or radiation and are used to provide information on the background noise at the surface of the image sensing device 100. In some implementations, the dummy pixel region 120 may include a plurality of dummy pixels designed to receive different quantities of incident light or radiation from one another. Light quantities incident upon the respective dummy pixels may be controlled by, for example, forming a light quantity control pattern (a shade mask) over each respective dummy pixel and different dummy pixels may be designed with different light quantity control patterns to provide different levels of shading to achieve the different quantities of incident light or radiation. The light quantity control patterns may enable the respective dummy pixels to have different sizes of open regions through which light is incident on the respective dummy pixels. Alternatively, light quantities incident upon the respective dummy pixels may be controlled by allowing the respective dummy pixels to have different sizes of photodiodes (dummy photodiodes). The light quantity control pattern will be described in detail later.

The specific example in FIG. 1 illustrates square-shaped active pixels {P (1,1) to P (X,Y)} and square-shaped dummy pixels {DP (1,1) to DP (X,2)}, the active pixels and the dummy pixels may be designed to have various other shapes.

Figure 2:
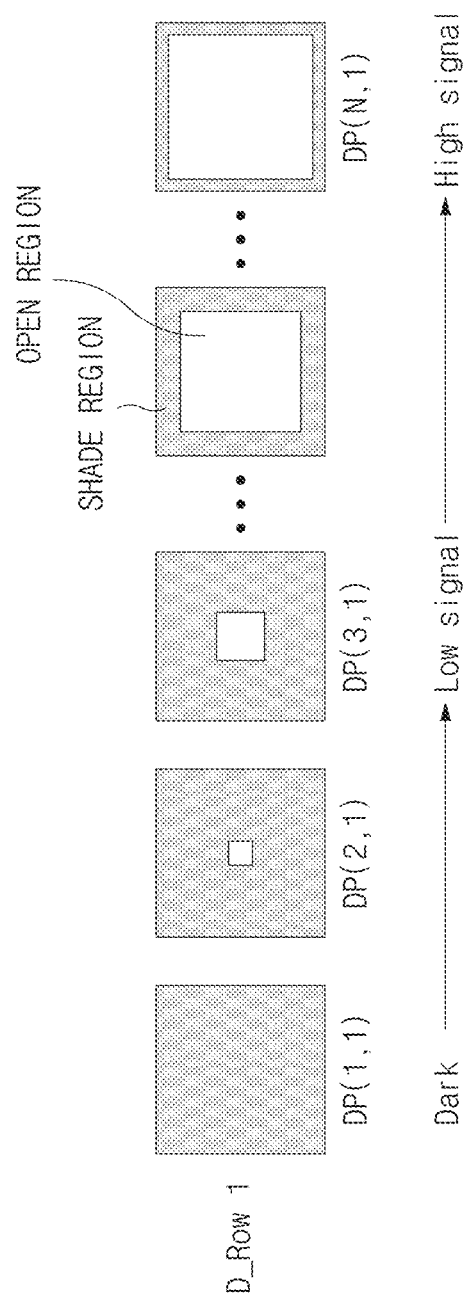
FIG. 2 is a view illustrating exemplary light quantity control patterns formed in the dummy pixels of a dummy pixel region based on an embodiment of the disclosed technology.

FIG. 2 is a view illustrating exemplary light quantity control patterns for dummy pixels based on an implementation of the disclosed technology. FIGS. 3A and 3B are cross-sectional views illustrating dummy pixels taken along the line A-A' shown in FIG. 1.

Referring to FIGS. 2, 3A, and 3B, light quantity control patterns may be formed in the first to N-th dummy pixels {for example, DP (1,1) to DP (N,1), where N≤X} connected to the first dummy row line (D_Row 1). The light quantity control patterns may act as a shading mask and cover a region in light incident surfaces of the dummy pixels. For example, the light quantity control pattern may include a material that reflects or absorbs light to shield light from entering some regions of the dummy pixels. A light quantity control pattern may be designed to include a shaded region in the light incident surface of a dummy pixel to block or reduce light that can be received by the dummy pixel in the shaded region and the remaining region(s) in the dummy pixel may be open to allow to enter the dummy pixel. As shown in FIG. 2, one row of dummy pixels may be designed to have light quantity control patterns that have different shapes from one another among the dummy pixels. In the specific row illustrated, the first to N-th dummy pixels {DP (1,1) to DP (N,1)} may have different sizes of open regions by the particular light quantity control patterns so that the dummy pixel DP (1,1) may be completed shaded just like a black pixel without receiving any incident light or radiation while other dummy pixels have varying levels of shading to increase the size of the open regions for receiving incident light or radiation.

The light quantity control pattern may be formed of or include a selective material to provide a desired shading, e.g., a tungsten grid mask used as a shade mask in some implementations. FIGS. 3A and 3B show cross-sectional views of implementations of the dummy pixel region, in which the light quantity control pattern is located differently from each other. In the image sensing device 100, each of the dummy pixels may include a dummy photoelectric conversion element (e.g., a dummy photodiode DPD 1 to N as shown in FIGS. 3A and 3B). A color filter (CF) may be formed over the dummy photodiode DPD 1 to N. A micro-lens (ML) may be formed over the color filter (CF) to correspond to the dummy pixels. FIG. 3A shows that the light quantity control pattern is formed between a color filter (CF) and a micro-lens (ML), and FIG. 3B shows that the light quantity control pattern is formed between the color filter (CF) and each of the dummy photodiodes (DPD 1 to DPD N).

The open regions of the first to N-th dummy pixels {DP (1,1) to DP (N,1)} may have different sizes from one another. In an example shown in FIGS. 2, 3A and 3B, the sizes of the open regions in the first to N-th dummy pixels increase sequentially from the first to N-th dummy pixels. In some implementations, the sizes of the open regions in the dummy pixels linearly increase from the first to N-th dummy pixels. For example, the entirety of the first dummy pixel DP (1,1) may be shielded by the light quantity control pattern such that any light is not incident upon the dummy photodiode (DPD 1). The light quantity control patterns may be formed in the second dummy pixel DP (2,1) to allow a region including a center part of the second dummy pixel DP (2,1) to be opened in a square shape such that light can be incident upon the dummy photodiode (DPD 2) only through the corresponding open region. The open region of the second dummy pixel DP (2,1) may be designed to have a predetermined size to satisfy various purposes including a testing purpose. The light quantity control patterns may be formed in the third dummy pixel DP (3,1) to allow a region including a central part of the third dummy pixel DP (3,1) to be opened in a square shape with a size greater than that of that of the second dummy pixel DP (2,1). The open region of the third dummy pixel DP (3,1) may be twice as large as the open region of the second dummy pixel DP (2,1). As described above, the open regions respectively formed in the center parts of the dummy pixels {DP (1,1) to DP (N,1)} may have sizes which increase in a first direction from the first dummy pixel DP (1,1) to the N-th dummy pixel DP (N,1), i.e., the right direction in FIG. 2.

Although FIG. 2 illustrates the exemplary case in which the light quantity control patterns are formed in some dummy pixels arranged in the first dummy row line (D_Row 1) for convenience of description, other implementations are also possible. For example, the light quantity control patterns may also be formed in some dummy pixels arranged in the second dummy row line (D_Row 2).

Although FIG. 2 illustrates the exemplary case in which the first dummy pixel DP (1,1) is completely shielded or shaded for convenience of description other implementations are also possible such that the first dummy pixel DP (1,1) is not completely shielded or shaded. For example, instead of being completely shielded, the first dummy pixel DP (1,1) may be designed to have its open region. a value of the optical black region (not shown) may be allocated to the completely shielded dummy pixel as needed.

Although FIG. 2 illustrates that the light quantity control patterns are respectively formed in the dummy pixels as being separated from one another, the illustration is a specific example only and other implementations are also possible. For example, the light quantity control patterns for different dummy pixels in the dummy region 120 may be formed as a single pattern having a plurality of open regions for the respective dummy pixels as shown in FIG. 3A or 3B. In this case, the light quantity control patterns may be connected to each other between spaces over two adjacent dummy pixels.

The image sensing device 100 implementing the disclosed technology allows varying amounts of light incident upon corresponding dummy pixels in the dummy pixel region by using the light quantity control patterns in the dummy pixel region 120 as shown in FIG. 2. Accordingly, the use of different exposure times to measure linear well capacitance (LWC) of the image sensing device 100 becomes not necessary and can be omitted. That is, the image sensing device 100 can acquire a same result as in a conventional test that is executed using different integration times without carrying out test using different integration times. This aspect of the disclosed technology can be used to reduce and save an overall time in performing the test and the number of calculations involved with the test.

For example, in order to measure the linear well capacitance (LWC) of the image sensing device using a conventional test by performing sensing operations under different exposure or integrations times, it is necessary to observe changes in output signals from a single image sensing device by changing an exposure or integration time or a quantity of light. For example, to measure the changes of the output signals associated with 40 different exposure times for an analysis, the image sensing device needs tested for forty times by repeatedly adjusting or changing the exposure time to have forty different exposure times. While adjusting the exposure time, it is also necessary to measure the quantity of light incident upon each pixel during each of the forty integration or exposure times. If ten image capturing actions for each exposure time are needed, a total of 400 tests (40×10) must be carried out and data from each test need to be calculated for the analysis.

Implementations of the disclosed technology propose providing a dummy pixel region in the image sensing device, which includes dummy pixels with the light quantity control patterns, and varying the amount of light incident upon each dummy pixel by using the light quantity control patterns in different dummy pixels. For example, by including 40 (N=40) dummy pixels in the dummy pixel region, it is possible to obtain, from a single image capturing action, the output signals that are same as those obtained from the conventional test involved with measurements performed by using different exposure times. This is a significant reduction in terms of efforts such as time and resources as compared to the case performing the conventional test by repeatedly changing the exposure time. In some implementations of the disclosed technology, to control the amount of light incident upon each dummy pixel, the open regions of the dummy pixels in the dummy pixel region 120 may be designed, for example, to increase in size as shown in FIG. 2. The benefits of reducing time and resources to obtain the output signals using the dummy pixels with the light quantity control patterns become more obvious as the number of image capturing actions required increases. Assume that ten image capturing actions are needed for each exposure time. The image sensing device according to the embodiment of the disclosed technology can obtain the output signals by performing the image capturing actions ten times, while the conventional image sensing devices needs 400 repeated tests to obtain the same output signals.

For this purpose, the sizes of the open regions formed in the dummy pixels {DP (1,1) to DP (N,1)} may be controlled as necessary to achieve a desired variation of the signal levels received at different dummy pixels. In some implementations, the sizes of the open regions formed in the dummy pixels are linearly increased from the first dummy pixel DP (1,1) to the N-th dummy pixel DP (N,1). The ratio of the increase may correspond to a change ratio of the exposure times used in the conventional test. For example, if the exposure times are changed in the conventional test in the order of 0 ms→1 ms→2 ms→3 ms, . . . , the sizes of the open regions of the dummy pixels {DP (1,1) to DP (N,1)} may increase in the order of 0 times→a predetermined size→twice of the predetermined size→three times of the predetermined size, . . . along the first direction from the most left dummy pixel to the most right dummy pixel in dummy pixel region. In other words, after the size of the open region of the first dummy pixel DP (1,1) is arbitrarily decided, the size of the open region of the second dummy pixel DP (2,1) may be determined as two times of that of the first dummy pixel DP (1,1), and the size of the open region of the third dummy pixel DP (3,1) may be determined as three times of that of the first dummy pixel DP (1,1). In this way, the open regions of the dummy pixels may be formed.

Figure 4A:
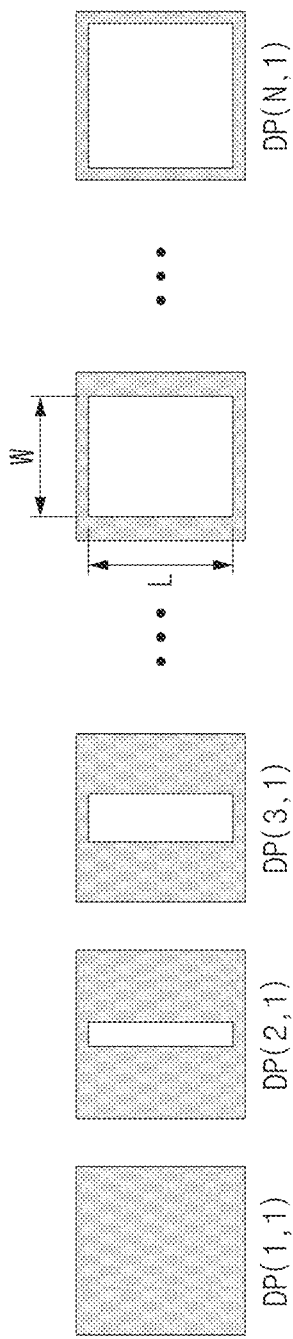
FIG. 4A is a view illustrating light quantity control patterns of dummy pixels based on another embodiment of the disclosed technology.
Figure 4B:
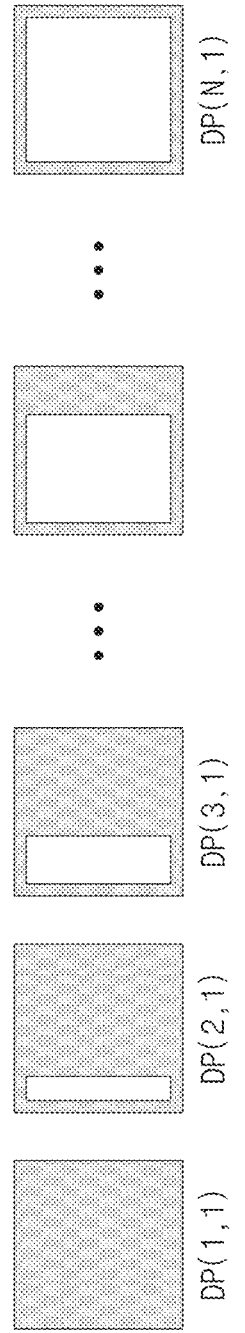
FIG. 4B is a view illustrating light quantity control patterns of dummy pixels based on another embodiment of the disclosed technology.

FIGS. 4A and 4B are views illustrating light quantity control patterns of the dummy pixels according to another embodiment of the disclosed technology.

Although FIG. 2 illustrates the exemplary open regions as having square shapes formed at the center parts of the corresponding dummy pixels {DP (1,1) to DP (N,1)}, the disclosed technology is not limited thereto and other implementations are also possible.

Referring to FIGS. 4A and 4B, each of the open regions may be formed in a slit or rectangular shape, the length (L) of which may be constantly maintained in the second to the N-th dummy pixels and the width (W) of which may be increased in the first direction from the second to the N-th dummy pixels. In some implementations, the widths of open regions may be changed in the first direction to correspond to the change ratio of exposure times in the conventional test.

The locations of the open regions may be varied in implementations of the disclosed technology. The open regions according to the embodiment may be located at the center parts of the respective dummy pixels as shown in FIG. 4A, or may be located to deviate from the center of the respective dummy pixels as shown in FIG. 4B.

Figure 5:
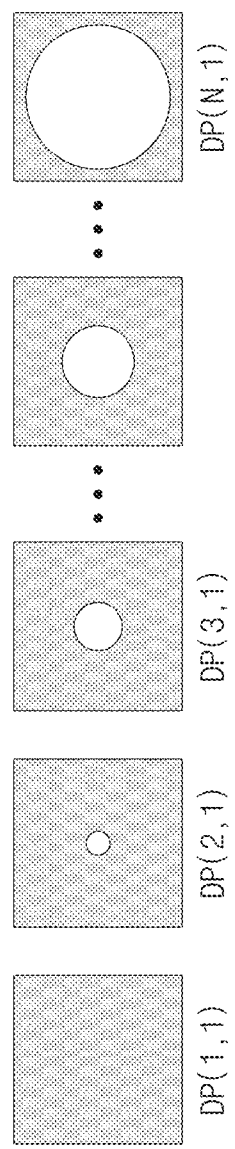
FIG. 5 is a view illustrating light quantity control patterns of dummy pixels based on another embodiment of the disclosed technology.

FIG. 5 is a view illustrating light quantity control patterns of the dummy pixels according to another embodiment of the disclosed technology.

Although the above-mentioned embodiments of the disclosed technology show the exemplarily open regions as having the square shape or the slit or rectangular shape, the disclosed technology is not limited thereto and other implementations are also possible. For example, each of the open regions in the second to N-th dummy pixels may be formed in a circular (or oval) shape as shown in FIG. 5.

Each of the open regions may be formed in various shapes as shown in FIGS. 2 to 5, and the open regions of the dummy pixels may be designed to change its size locations in various manners. For example, FIGS. 2 to 4A and FIG. 5 show the open regions that are sequentially increased from the second dummy pixel to the N-th dummy pixel and located at the center parts of the respective dummy pixels. FIG. 4B shows the open regions that are sequentially increased from the second dummy pixel to the N-th dummy pixel and located deviated from the center parts of the respective dummy pixels.

Figure 6:
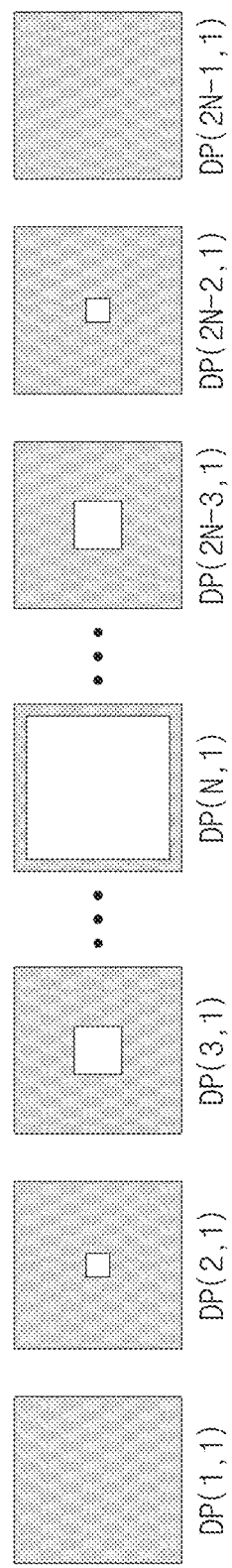
FIG. 6 is a view illustrating light quantity control patterns of dummy pixels based on another embodiment of the disclosed technology.

FIG. 6 is a view illustrating light quantity control patterns of dummy pixels according to another embodiment of the present disclosure.

Referring to FIG. 6, the open regions may be symmetrically arranged in the first direction with respect to the N-th dummy pixel DP (N,1). For example, in the example of FIG. 6, the number of the dummy pixels arranged in a same row is two times of that in the example of FIGS. 2 to 5. Thus, in FIG. 6, the total 2N dummy pixels, {DP (1,1) to DP (2N−1,1)} are arranged in the same row. The open regions of the dummy pixels {DP (1,1) to DP (N,1)} from among the dummy pixels {DP (1,1) to DP (2N−1,1)} may be sequentially increased in size in the first direction, and the open regions of the dummy pixels {DP (N+1,1) to DP (2N−1,1)} from among the dummy pixels {DP (1,1) to DP (2N−1,1)} may be sequentially reduced in size in the first direction. In some implementations, the increasing ratio from the first dummy pixel DP (1,1) to the N-th dummy pixel DP (N,1) may correspond to the decreasing ratio from the (N+1)th dummy pixel DP (N+1,1) to the (2N−1)th dummy pixel DP (2N−1,1). In some implementations, increasing ratio and/or the decreasing ration in sizes of the open regions in the dummy pixels are linearly changed.

FIGS. 7A and 7B are views illustrating light quantity control patterns of dummy pixels according to another embodiment of the disclosed technology.

Referring to FIGS. 7A and 7B, the open regions having the slit or rectangular shape may be arranged symmetrically with respect to the dummy pixel DP (N,1). FIG. 7A shows that the open regions are located at the left sides of the dummy pixels and FIG. 7B shows that the open regions are located at the right sides of the dummy pixels.

Although the above-mentioned embodiments have exemplarily disclosed the cases in which the open regions are formed in dummy pixels sequentially arranged in a single dummy row line for convenience of description, the disclosed technology is not limited thereto. For example, the arrangements shown in FIGS. 2 to 7 of the open regions may also be applied to the dummy pixels arranged in different dummy row lines as necessary. Thus, the plurality of dummy pixels having the open regions with desired size may be distributed throughout the entire dummy pixel region 120 including plural dummy row lines.

Figure 8:
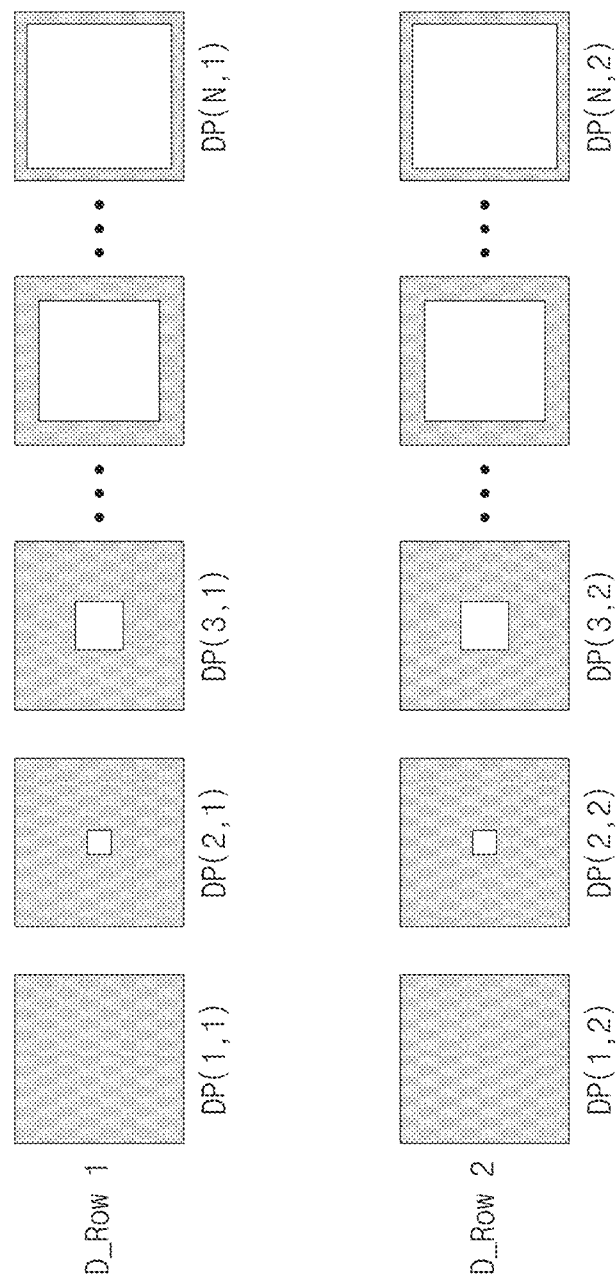
FIG. 8 is a view illustrating light quantity control patterns of dummy pixels based on embodiments of the disclosed technology.

FIG. 8 is a view illustrating light quantity control patterns of dummy pixels according to another embodiment of the disclosed technology.

Referring to FIG. 8, the light quantity control patterns shown in FIG. 2 may also be formed not only in the dummy pixels {DP (1,1) to DP (N,1)} of the first dummy row line D_Row 1 but also in the dummy pixels {DP (1,2) to DP (N,2)} of the second dummy row line D_Row 2. Thus, the light quantity control patterns may include first light quantity control patterns formed in the dummy pixels {DP (1,1) to DP (N,1)} and second light quantity control patterns formed in the dummy pixels {DP (1,2) to DP(N,2)}. The open regions of the first light quantity control patterns and the open regions of the second light quantity control patterns may sequentially increase in size in the first direction as explained with respect to FIG. 2.

Having the open regions with different sizes among the dummy pixels in the dummy pixel region 120 allows to significantly reduce time and resources required to measure a performance of the image sensing device 100. The implementation shown in FIG. 8, i.e., arranging the dummy pixels with differently sized open regions in two different row lines instead of the single row line further reduces time and resources involved with the image capturing actions. For example, assume that ten image capturing actions are needed to measure LWC of the image sensing device 100 for each exposure time. If using the dummy pixels arranged in the single dummy row as shown in FIGS. 2 to 7, it is necessary to repeat 10 times of image capturing operation to complete ten image capturing actions. However, if using the dummy pixels with the light quantity control patterns arranged in the two row lines, for example, the first and second light quantity control patterns as provided in FIG. 8, the number of performing the image capturing operation can be reduced to five from ten as required in the case having the dummy pixels arranged in the single row line.

Although FIG. 8 illustrates the exemplary case in which the dummy pixels in the first row line and the second row line have the same-structured light quantity control patterns, the disclosed technology is not limited thereto. For example, the same-structured light quantity control patterns may be formed in at least three different row lines of the dummy pixels. In this way, the same-structured light quantity control patterns may be formed in multiple row lines as necessary according to the size of the dummy pixel region 120.

Figure 9:
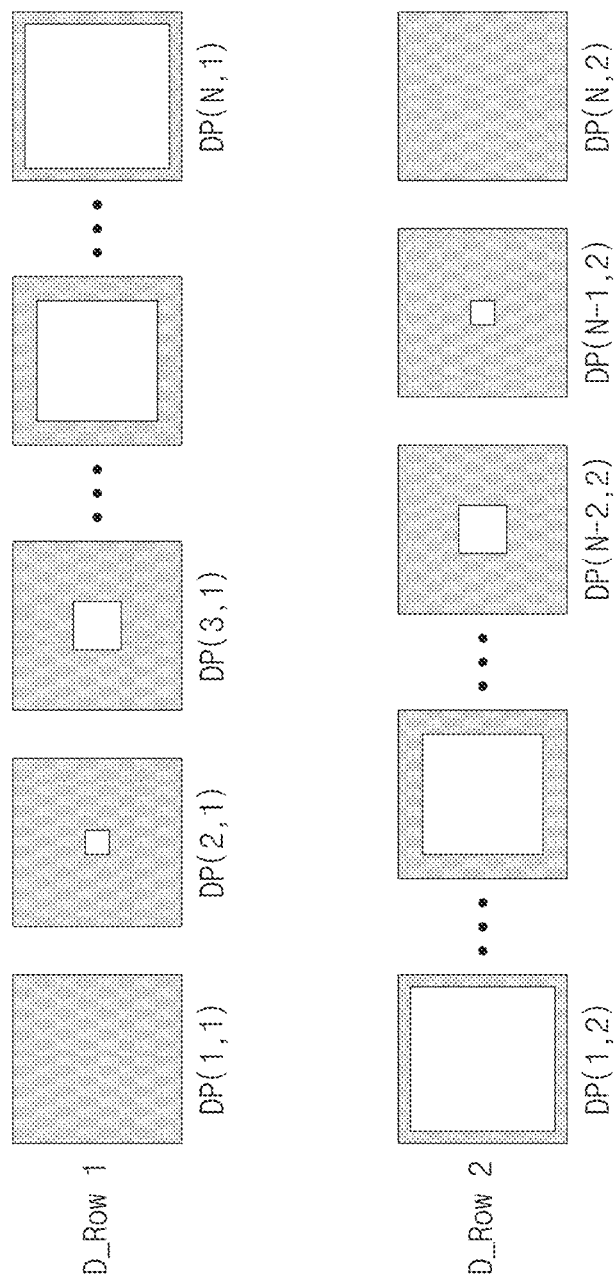
FIG. 9 is a view illustrating light quantity control patterns of dummy pixels based on another embodiment of the disclosed technology.

Although FIG. 8 shows the implementation where the dummy pixels arranged two dummy row lines have the light quantity control patterns that change in the same manner as each other, the disclosed technology is not limited thereto and other implementations are also possible. FIG. 9 shows an implementation of light quantity control patterns of dummy pixels arranged in multiple dummy row lines. In an implementation in which the light quantity control patterns are formed in multiple dummy row lines, the sizes of the open regions of light quantity control patterns formed in two dummy row lines may change in different manners from each other. For example, as shown in FIG. 9, the open regions of the first light quantity control patterns formed in the dummy pixels {DP (1,1) to DP (N,1)} of the first dummy row line D_Row 1 may increase in size in the first direction from the first dummy pixel DP (1,1) to the N-th dummy pixel DP (N,1), and the open regions of the second light quantity control patterns formed in the dummy pixels {DP (1,2) to DP (N,2)} of the second dummy row line D_Row 2 may decrease in size in the first direction from the first dummy pixel DP (1,2) to the N-th dummy pixel DP (N,2).

Figure 10A:
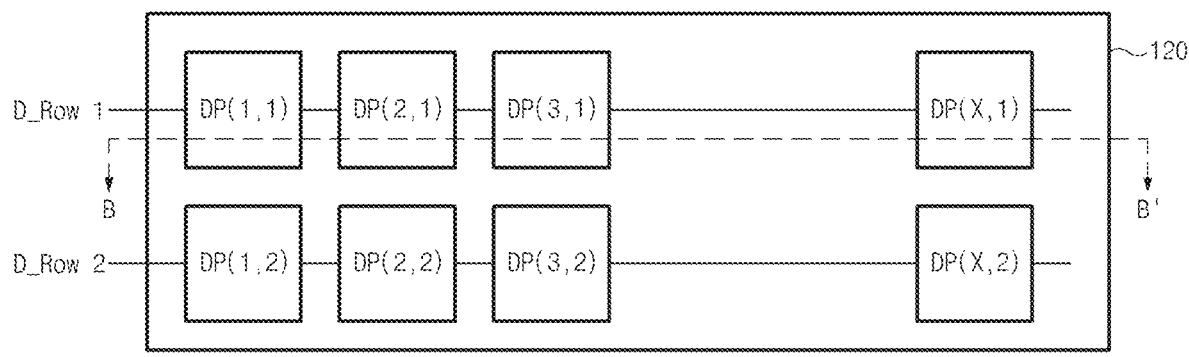
FIG. 10A is a plan view illustrating exemplary dummy pixels arranged along dummy row lines D_Row 1 and D_Row 2.
Figure 10B:
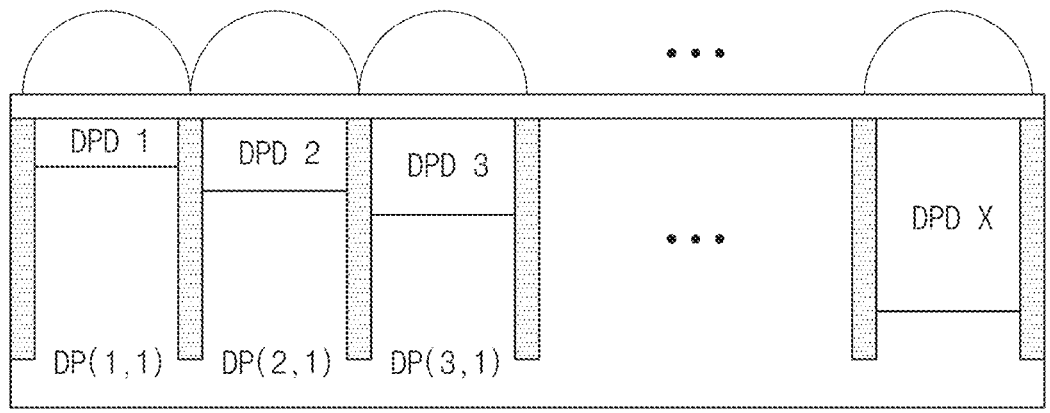
FIGS. 10B and 10C are cross-sectional views illustrating dummy pixels taken along the line B-B' shown in FIG. 10A and arranged along dummy row lines.
Figure 10C:
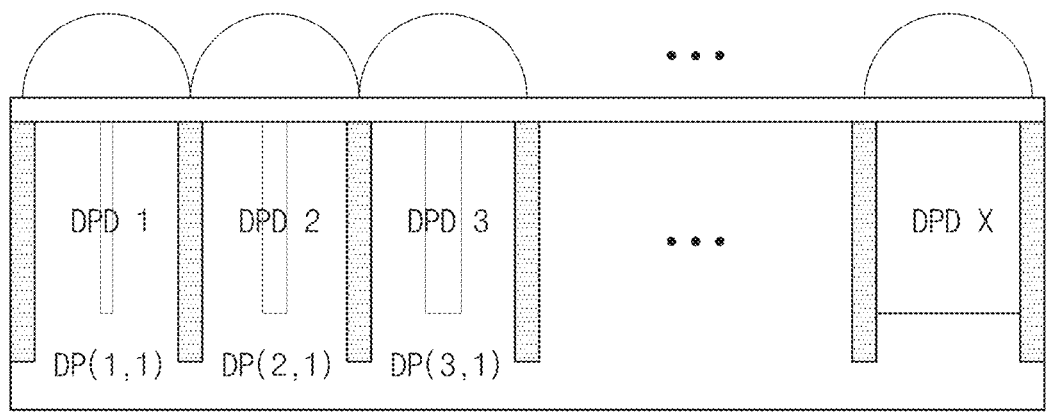

FIG. 10 is a view illustrating dummy pixels according to another embodiment of the disclosed technology. FIG. 10A is a plan view illustrating dummy pixels arranged along dummy row lines D_Row 1 and D_Row 2. FIGS. 10B and 10C are cross-sectional views illustrating dummy pixels taken along the line B-B' shown in FIG. 10A and arranged along dummy row lines D_Row 1.

The above-mentioned embodiments as shown in FIG. 2 to FIG. 9 suggest controlling the sizes of the open regions of the dummy pixels using the light quantity control patterns used as a shade mask, such that different quantities of light can be incident upon the respective dummy pixels needed for the LWC measurement.

Referring to FIG. 10, the dummy photodiodes DPD 1 to DPD X configured to convert light incident on the respective dummy pixels into electrical signals may be formed to have different sizes in the respective dummy pixels.

FIG. 10B shows the implementation where the dummy photodiodes DPD 1 to DPD X have the same width along a horizontal direction and have different heights along a vertical direction. The heights of the dummy photodiodes DPD 1 to DPD X may gradually increase in the first direction from the first dummy photodiode DPD 1 to the X-th dummy photodiode DPD X. FIG. 10C shows the implementation where the dummy photodiodes DPD 1 to DPD X have the same height along the vertical direction and have different widths along the horizontal direction. The widths of dummy photodiodes DPD 1 to DPD X may gradually increase in the first direction from the first dummy photodiode DPD 1 to the X-th dummy photodiode DPD X.

The image sensing device according to the embodiments of the disclosed technology can provide a same effect as in performing a test associated with different exposure times by using the light quantity control patterns to allow different amount of light to enter the respective dummy pixels or by using the differently sized dummy photodiodes in the dummy pixels. In the disclosed technology, the dummy pixels can have different amount of light in response to a single image capturing action, there is no need to repeat the image capturing action with different exposure times, which results in the significant reduction of time and resources required in the prior techniques to obtain a same result.

What is claimed is:

1. An image sensing device comprising:
   an active pixel region configured to include a plurality of active pixels which detect light of a scene to produce pixel signals representing the detected scene including spatial information of the detected scene;
   a dummy pixel region including dummy pixels located at different locations from locations of the active pixels of the active pixel region, each dummy pixel structured to detect light; and
   a light quantity control pattern located over the dummy pixel region and configured to respectively provide different optical shading over the dummy pixels to control different quantities of light to be incident upon the respective dummy pixels to generate different dummy pixel output signals,
   wherein the light quantity control pattern is configured to allow the respective dummy pixels to have open regions with different sizes from one another, the light being incident on the respective dummy pixels through the open regions.

2. The image sensing device according to claim 1, wherein the open regions are regions that are not shielded by the light quantity control pattern in light incident surfaces of the plurality of dummy pixels.

3. The image sensing device according to claim 1, wherein the light quantity control pattern is formed in the plurality of dummy pixels arranged in a first dummy row line, and allows the open regions of the respective dummy pixels to have sizes increasing in a direction.

4. The image sensing device according to claim 3, wherein the light quantity control pattern includes:
   square-shaped open regions, widths of which are increased with a constant ratio in the direction;
   slit-shaped open regions, lengths of which are constantly maintained and widths of which are increased with the constant ratio in the direction; or
   circular open regions, widths of which are increased with the constant ratio in the direction.

5. The image sensing device according to claim 1, wherein the light quantity control pattern is formed in the plurality of dummy pixels arranged in a first dummy row line, and allows the open regions of the respective dummy pixels to be arranged symmetrically with respect to a dummy pixel arranged in a middle of the first dummy row line.

6. The image sensing device according to claim 1, wherein the dummy pixels are arranged in a first dummy row line and a second dummy row line of the dummy pixel region.

7. The image sensing device according to claim 6, wherein the light quantity control pattern includes:
   a first light quantity control pattern formed in some of the plurality of dummy pixels arranged in the first dummy row line and configured to allow the open regions of the respective dummy pixels to have sizes sequentially increased in a direction; and
   a second light quantity control pattern formed in remaining dummy pixels arranged in the second dummy row line and configured to allow the open regions of the respective dummy pixels to have sizes sequentially reduced in the direction.

8. The image sensing device according to claim 1, wherein each of the plurality of dummy pixels includes:
   a dummy photodiode; and
   a color filter located over the dummy photodiode.

9. An image sensing device comprising:
   an active pixel region including a plurality of active pixels;
   a dummy pixel region located separately from the active pixel region and including a plurality of dummy pixels that are structured to receive different quantities of incident light, and
   wherein the plurality of dummy pixels includes open regions with different sizes from one another to receive the different quantities of incident light.

10. The image sensing device according to claim 9, wherein each of the plurality of dummy pixels further includes:
    a shade region configured to shield the incident light and define a corresponding open region.

11. The image sensing device according to claim 9, wherein the open regions have sizes that are gradually increased in a first direction.

12. The image sensing device according to claim 10, wherein the plurality of dummy pixels include:
    square-shaped open regions, widths of which are increased with a constant ratio in a direction;
    slit-shaped open regions, lengths of which are constantly maintained and widths of which are increased with the constant ratio in the direction; or
    circular open regions, widths of which are increased with the constant ratio in the direction.

13. The image sensing device according to claim 9, wherein the dummy pixels are structured to respectively include different photosensors in different sizes to receive different amounts of incident light.

14. The image sensing device according to claim 13, wherein the photosensors in the dummy pixels have a same width along a horizontal direction, and have different heights from one another along a vertical direction.

15. The image sensing device according to claim 13, wherein the photosensors in the dummy pixels have a same height along a vertical direction, and have different widths from one another along a horizontal direction.

16. The image sensing device according to claim 13, wherein the sizes of the photosensors in the dummy pixels increase along a direction through which the dummy pixels are arranged.

17. An image sensing device comprising:
an active pixel region configured to include a plurality of active pixels which detect light of a scene to produce pixel signals representing the detected scene including spatial information of the detected scene;
a dummy pixel region including dummy pixels located at different locations from locations of the active pixels of the active pixel region, each dummy pixel structured to detect light; and
a light quantity control pattern located over the dummy pixel region and configured to respectively provide different optical shading over the dummy pixels to control different quantities of light to be incident upon the respective dummy pixels to generate different dummy pixel output signals,
wherein each of the plurality of dummy pixels includes:
a dummy photodiode; and
a color filter located over the dummy photodiode.

18. The image sensing device according to claim 17, wherein the light quantity control pattern is located between the dummy photodiode and the color filter.

19. The image sensing device according to claim 17, wherein the light quantity control pattern is located over the color filter.

\* \* \* \* \*